(12) United States Patent
Yu

(10) Patent No.: US 7,635,204 B2
(45) Date of Patent: Dec. 22, 2009

(54) LIGHT EMITTING ASSEMBLY AND BACKLIGHT DEVICE EMPLOYING THE SAME

(75) Inventor: Tai-Cherng Yu, Guangdong (CN)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/308,333

(22) Filed: Mar. 16, 2006

(65) Prior Publication Data

US 2006/0227554 A1 Oct. 12, 2006

(30) Foreign Application Priority Data

Apr. 6, 2005 (CN) .................... 2005 1 0034039

(51) Int. Cl.
*F21V 29/00* (2006.01)
(52) U.S. Cl. .................. 362/294; 362/231; 362/555; 362/252; 362/800; 362/623; 362/612; 362/609; 362/631
(58) Field of Classification Search .............. 362/252, 362/231, 294, 97, 555, 612, 609, 631, 623
See application file for complete search history.

(56) References Cited

U.S. PATENT DOCUMENTS

| | | | | |
|---|---|---|---|---|
| 5,324,962 | A * | 6/1994 | Komoto et al. ............... 257/89 |
| 6,540,377 | B1 * | 4/2003 | Ota et al. ..................... 362/231 |
| 6,678,171 | B1 * | 1/2004 | Drews et al. ................. 361/825 |
| 6,789,921 | B1 * | 9/2004 | Deloy et al. ................. 362/252 |
| 6,789,923 | B2 | 9/2004 | Liao |
| 6,826,059 | B2 * | 11/2004 | Bockle et al. ................ 363/17 |
| 6,853,150 | B2 * | 2/2005 | Clauberg et al. ......... 315/185 R |
| 6,969,189 | B2 | 11/2005 | Lee et al. |
| 7,025,473 | B2 * | 4/2006 | Dokoupil ..................... 362/640 |
| 2003/0193802 | A1 * | 10/2003 | Luk ............................. 362/249 |
| 2004/0239243 | A1 * | 12/2004 | Roberts et al. .............. 313/512 |
| 2006/0012989 | A1 * | 1/2006 | Lee .............................. 362/231 |
| 2006/0023448 | A1 * | 2/2006 | Mok et al. ................... 362/231 |

FOREIGN PATENT DOCUMENTS

CN 1560672 A 1/2005
EP 1475835 A2 * 11/2004

* cited by examiner

*Primary Examiner*—Sandra L O'Shea
*Assistant Examiner*—Jessica L McMillan
(74) *Attorney, Agent, or Firm*—Winston Hsu

(57) ABSTRACT

A light emitting assembly (50) includes a metal circuit board (54) having a first surface and an opposite second surface, a light emitting module (52) mounted on the first surface of the metal circuit board, and a cooling module (58) attached to the second surface of the metal circuit board. A backlight device (90) includes a reflection plate (91), a diffuser sheet (93) disposed on the reflection plate and a plurality of light emitting assemblies (92) regularly arranged between the reflection plate and the diffuser sheet. Each light emitting assembly includes a metal circuit board (922) having a first surface and an opposite surface, a light emitting module (921) mounted on the first surface of the metal circuit board and a cooling module (923) attached to the second surface of the metal circuit board. The present light emitting assembly and backlight device can increase heat abstraction efficiency.

15 Claims, 8 Drawing Sheets

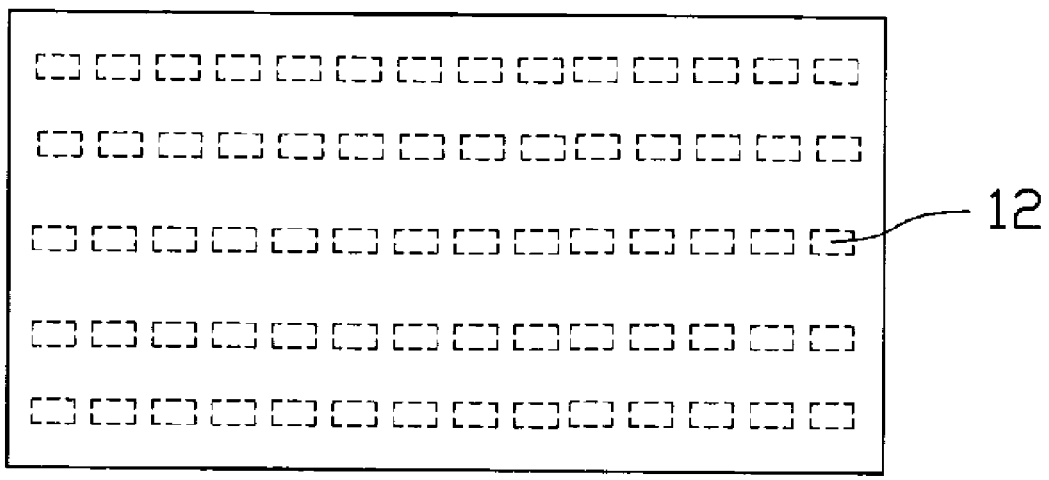
FIG, 8 (RELATED ART)

LIGHT EMITTING ASSEMBLY AND BACKLIGHT DEVICE EMPLOYING THE SAME

FIELD OF THE INVENTION

The present invention relates to a light emitting assembly, and a backlight device employing the same.

DESCRIPTION OF RELATED ART

Nowadays, liquid crystal materials are widely utilized in various liquid crystal displays which have different sizes for different applications, such as TVs, liquid crystal projectors, mobile telephones, personal digital assistants (PDA), etc. Because liquid crystal itself cannot emit light, light sources must be utilized to illuminate liquid crystal for image display. The light sources are called backlight source since they are usually configured behind liquid crystal panels. A combination of all components behind the liquid crystal panels, including the light sources, is generally referred to as a backlight device. Usually, backlight devices can be classified into edge type backlight devices and direct type backlight devices.

Typically, cold cathode fluorescent lamps (CCFLs) and light emitting diodes (LEDs) are employed as light sources in a backlight device. However, backlight devices employing the cold cathode fluorescent lamps as light sources have the disadvantages of having high energy consumption, low uniformity of brightness, poor purity of white light, and high-priced cost. In addition, after being used for a period of time, the brightness of CCFLs is degraded and a color of light is apt to shift. The cold cathode fluorescent lamps have a service life of about 15,000 to 25,000 hours. Furthermore, CCFL light sources only covers 75 percent of NTSC (national television system committee) color space. So, CCFL light sources cannot satisfy high quality liquid crystal display requirement.

Compared to CCFL light sources, high power light emitting diodes (high power LEDs) can cover 105 percent of color space defined by the NTSC. In addition, the high power LEDs have many advantages, such as high brightness, low energy consumption, long service life, and so on. Therefore, the high power LEDs are more promising for liquid crystal displays.

Referring to FIGS. 7 and 8, a conventional direct type backlight device 10 utilizing high power LEDs as backlight sources mainly includes a reflection plate 11, a number of high power LEDs 12, a diffuser plate 13, a diffuser sheet 14, a prism sheet 15 and a dual brightness enhancement film 16. The high power LEDs 12 are regularly distributed on the reflection plate 11. The diffuser plate 13 is arranged on the high power LEDs 12 in parallel to the reflection plate 11. The diffuser sheet 14, the prism sheet 15 and the dual brightness enhancement film 16 are stacked on the diffuser plate 13 in sequence.

However, the high power LEDs are densely arranged inside a closed void, therefore, heat generated by the high power LEDs 12 is likely to be accumulated inside the closed void and a local temperature thereof will increase to an extremely high degree. The extremely high temperature will adversely affect performance of the high power LEDs 12 and reduce their service life.

What are needed, therefore, is a light emitting assembly with high cooling efficiency, and a light source module using the same.

SUMMARY OF INVENTION

A light emitting assembly according to one preferred embodiment includes a metal circuit board having a first surface and an opposite second surface, a light emitting module mounted on the first surface of the metal circuit board, and a cooling module attached to the second surface of the metal circuit board.

A backlight module according to one preferred embodiment includes a reflection plate, a diffuser sheet and a plurality of light emitting assemblies. The diffuser sheet is disposed on the reflection plate. The plurality of light emitting assemblies is regularly arranged between the reflection plate and the diffuser sheet. Each light emitting assembly includes a metal circuit board having a first surface and an opposite surface, a light emitting module mounted on the first surface of the metal circuit board; and a cooling module attached to the second surface of the metal circuit board.

Compared with conventional light emitting assemblies, the present light emitting assembly has following advantages. Because the cooling system is used, the heat generated by the light emitting module can be effectively dissipated. The temperature of the light emitting module is lowered and maintained in a safety range. Thus, the light emitting capability of the light emitting module can be fully exploited.

Other advantages and novel features will become more apparent from the following detailed description of the present light emitting assembly, when taken in conjunction with the accompanying drawings.

BRIEF DESCRIPTION OF DRAWINGS

Many aspects of the present light emitting assembly and backlight device can be better understood with reference to the following drawings. The components in the drawings are not necessarily to scale, the emphasis instead being placed upon clearly illustrating the principles of the present light emitting assembly and backlight device. Moreover, in the drawings, like reference numerals designate corresponding parts throughout the several views.

FIG. 8 is a schematic, top view of the backlight device of FIG. 7.

DETAILED DESCRIPTION

Reference will now be made to the drawings to describe preferred embodiments of the present light emitting assembly and backlight device, in detail.

Figure 1:
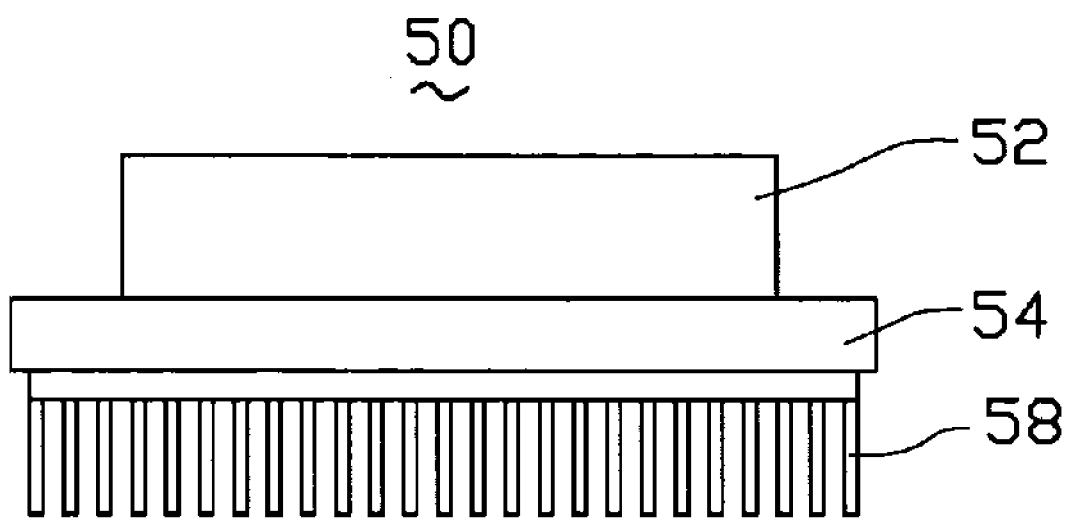
FIG. 1 is a schematic, side view of a light emitting assembly in accordance with a first preferred embodiment.

Referring to FIG. 1, a light emitting assembly 50 in accordance with a first preferred embodiment is shown. The light emitting assembly 50 includes a metal circuit board 54 having a first surface and an opposite second surface, a light emitting module 52 mounted on the first surface of the metal circuit board 54, and a heat dissipation device having a number of cooling fins 58 attached to the second surface of the metal circuit board 54. The light emitting module 52 can be a white LED capable of emitting white light. Preferably, a thermal interface material, such as a thermal grease, is sandwiched between the metal circuit board 54 and the light emitting module 52. Also the thermal interface material would preferably be sandwiched between the metal circuit board 54 and the cooling fins 58.

The metal circuit board 54 can be a metal printed circuit board having a driving circuit (not shown) formed therein for driving the light emitting module 52 to emit white light. The metal circuit board 54 and the cooling fins 58 can be made from a heat conductive material, such as copper, aluminum or a combination alloy thereof. Thus heat generated by the light emitting module 52 can be effectively conducted to the metal circuit board 54 and the cooling fins 58.

Figure 2:
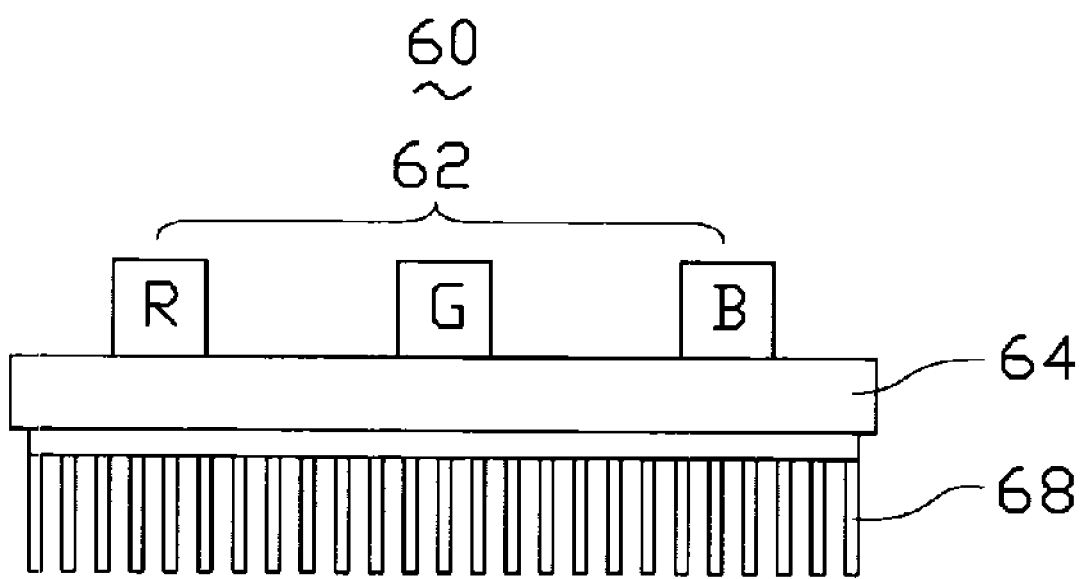
FIG. 2 is a schematic, side view of a light emitting assembly in accordance with a second preferred embodiment.

Referring to FIG. 2, a light emitting assembly 60 in accordance with a second preferred embodiment is shown. The light emitting assembly 60 includes a metal circuit board 64 having a first surface and an opposite second surface, a light emitting module 62 mounted on the first surface of the metal circuit board 64, and a heat dissipation device having a number of cooling fins 68 attached to the second surface of the metal circuit board 64. The light emitting module 62 includes a red LED (R), a green LED (G) and a blue LED (B) connected in series. The red LED, the green LED and the blue LED are capable of emitting red light, green light and blue light respectively. The light emitting module 62 is therefore capable of emitting white light by mixing the red light, green light and blue light emitted from the red LED, the green LED and the blue LED. The mixed light appears white to a human observer. The mixed white light can reach to a color coordinate of Cx=0.35, Cy=0.38.

Figure 3:
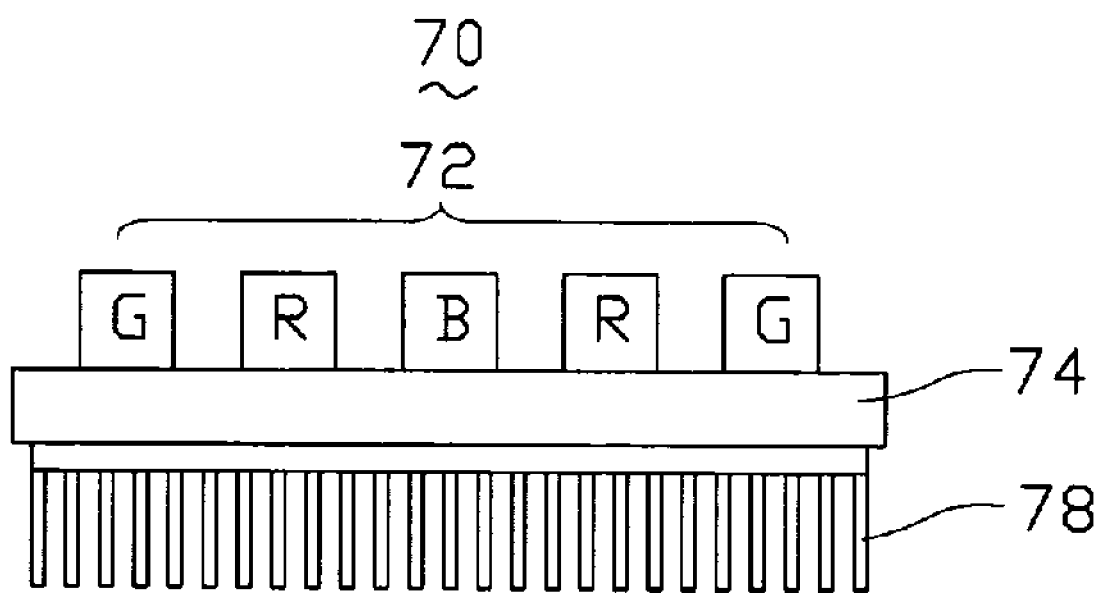
FIG. 3 is a schematic, side view of a light emitting assembly in accordance with a third preferred embodiment.

Referring to FIG. 3, a light emitting assembly 70 in accordance with a third preferred embodiment is shown. The light emitting assembly 70 includes a metal circuit board 74 having a first surface and an opposite second surface, a light emitting module 72 for emitting for example white light mounted on the first surface of the metal circuit board 74, and a heat dissipation device having a number of cooling fins 78 attached to the second surface of the metal circuit board 74. In this embodiment, the light emitting module 72 includes five LEDs, including two red LEDs (R), two green LEDs (G) and a blue LED (B). The five LEDs are configured in a line in an order of G-R-B-R-G. A distance between two neighboring LEDs is about 9 mm.

Figure 4:
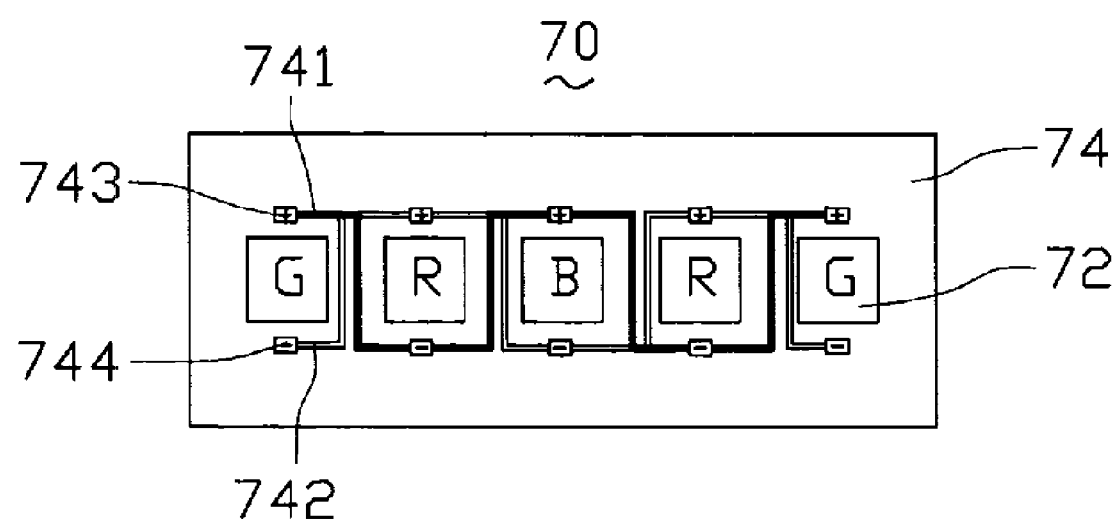
FIG. 4 is a schematic, top view of the light emitting assembly of FIG. 3.

Referring to FIG. 4, the five LEDs are mounted on the metal circuit board 74. The five LEDs can be connected in a manner such that a positive electrode 743 of an LED 72 is connected to a negative electrode 744 of a neighboring LED 72, a negative electrode 744 of the LED 72 is connected to a positive electrode 743 of the neighboring LED 72. Alternatively, all of the positive electrodes 743 of the five LEDs could be formed at one side of the light emitting module 72, and all the negative electrodes 744 of the five LEDs could be formed at an opposite side of the light emitting module 72. The metal circuit board 74 includes a driving circuit (not shown) formed therein. A first connection wire 741 is for connecting the positive electrodes 743 of G, the negative electrode 744 of R, the positive electrode 743 of B, the negative electrode 744 of R and the positive electrode 743 of G. A second connection wire 742 is for connecting the negative electrodes 744 of G, the positive electrode 743 of R, the negative electrode 744 of B, the positive electrode 743 of R and the negative electrode 744 of G (as shown in FIG. 4). The first connection wire 741 and the second connection wire 742 are formed in the metal circuit board 74. The driving circuit of the metal circuit board 74 can drive the five LEDs to emit light of different primary colors for achieving a white light by mixing the light of primary colors.

It is noted that, in the above embodiment, the white light can be achieved by mixing light of different primary colors, i.e., red light, green light and blue light emitted from corresponding LEDs. Thus, the light emitting module 72 may include more or less LEDs of different primary colors, so long as the emitted light of different primary colors can be mixed to achieve white light. For example, the light emitting module 72 may comprise a plurality of LEDs of different primary colors configured in a line in an order selected from the group consisting of R-G-B-G-R, G-R-B-B-R-G, R-G-B-B-G-R, G-R-B-G-G-B-R-G, G-R-B-B-R-G-G-R-B, and so on. In addition, the plurality of LEDs of different primary colors is arranged in one of a curve and a circle in an order selected from the group consisting of R-G-B, G-R-B-R-G, R-G-B-G-R, G-R-B-B-R-G, R-G-B-B-G-R, G-R-B-G-G-B-R-G, G-R-B-B-R-G-G-R-B, and so on.

Figure 5:
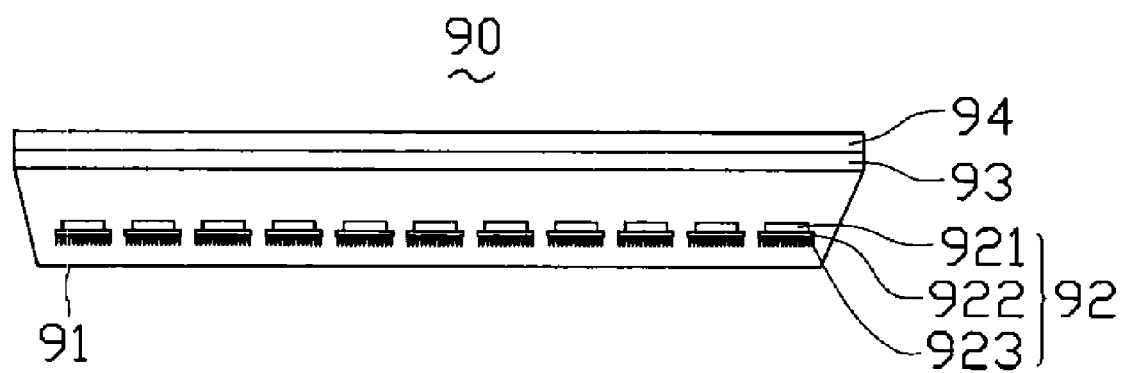
FIG. 5 is a schematic, side view of a backlight device in accordance with a fourth preferred embodiment.
Figure 6:
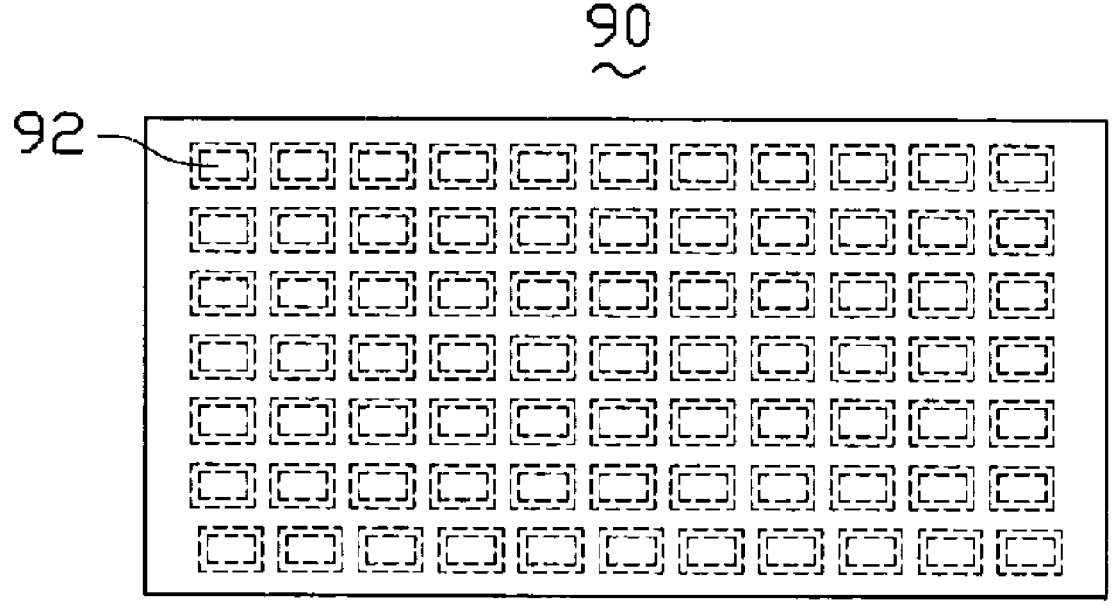
FIG. 6 is a schematic, top view of the backlight device of FIG. 5.
Figure 7:
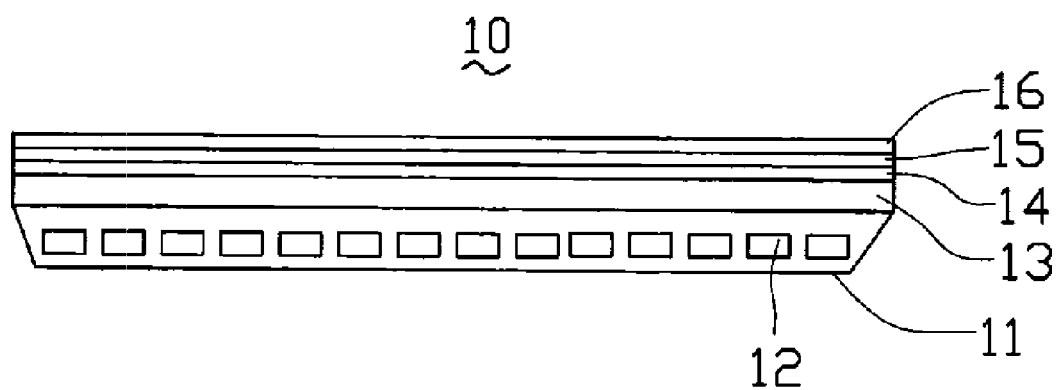
FIG. 7 is a schematic, side view of a conventional backlight device.

Referring to FIGS. 5 and 6, a backlight device 90, in accordance with a fourth preferred embodiment, is shown. The backlight device 90 mainly includes a reflection plate 91, a diffuser sheet 93, a plurality of light emitting assemblies 92 and a prism sheet 94. The diffuser sheet 93 is disposed on the reflection plate 91. The prism sheet 94 is configured on the diffuser plate 93. The light emitting assembly 92 can be one of the light emitting assemblies described in the above embodiments, and are regularly arranged between the reflection plate 91 and the diffuser sheet 93. Each of the light emitting assemblies 92 includes a metal circuit board 922 having a first surface and an opposite surface, a light emitting module 921 mounted on the first surface of the metal circuit board 922, and a cooling module having a number of cooling fins 923 attached to the second surface of the metal circuit board 922. The light emitting module 921 can be a white light LED, or an LED module that is capable of emitting light of different primary colors. A dual brightness enhancement film for enhancing brightness can be formed on the prism sheet 94.

The metal circuit board 922 and the cooling fins 923 can be made from heat conducting material, such as copper, or a combination alloy thereof. Thus heat generated by the light emitting module 921 can be effectively conducted to the metal circuit board 922 and the cooling fins 923.

We can also utilize other cooling modules instead of cooling fins, such as water cooling device or heat pipe, etc.

It is to be understood that the above-described embodiment is intended to illustrate rather than limit the invention. Variations may be made to the embodiment without departing from the spirit of the invention as claimed. The above-described embodiments are intended to illustrate the scope of the invention and not restrict the scope of the invention.

What is claimed is:

1. A light emitting assembly, comprising:
a metal circuit board having a first surface and an opposite second surface;
a light emitting module mounted on the first surface of the metal circuit board, P the light emitting module comprising a plurality of light emitting diodes each having a positive electrode and a negative electrode, the positive electrode of each light emitting diode being connected to the negative electrode of a neighboring light emitting diode, the negative electrode of the light emitting diode being connected to the positive electrode of the neighboring light emitting diode, the positive electrodes and the negative electrodes of the plurality of light emitting diodes being respectively formed on two opposite sides of the light emitting module, wherein the plurality of light emitting diodes comprising at least one red light emitting diode, at least one green light emitting diode and at least one blue light emitting diode such that mixed light emitted therefrom appears to be white light; and a cooling module attached to the second surface of the metal circuit board.

2. The light emitting assembly as claimed in claim 1, wherein the cooling module comprises a heat dissipation device having a number of cooling fins.

3. The light emitting assembly as claimed in claim 2, wherein the cooling fins are comprised of a heat conductive material.

4. The light emitting assembly as claimed in claim 3, wherein the heat conductive material is selected from the group consisting of copper, aluminum and a combination alloy thereof.

5. The light emitting assembly as claimed in claim 1, wherein the cooling module further comprises one of a water cooling device or at least a heat pipe.

6. The light emitting assembly as claimed in claim 1, wherein the metal circuit board is comprised of a heat conductive material.

7. The light emitting assembly as claimed in claim 6, wherein the heat conductive material is selected from the group consisting of copper, aluminum, and a combination alloy thereof.

8. The light emitting assembly as claimed in claim 1, wherein the plurality of light emitting diodes is configured in a line in an order selected from the group consisting of G-R-B-R-G, R-G-B-G-R, G-R-B-B-R-G, R-G-B-B-G-R, G-R-B-G-G-B-R-G, G-R-B-B-R-G-G-R-B, wherein, R represents a red light emitting diode, G represents a green light emitting diode, and B represents a blue light emitting diode.

9. The light emitting assembly as claimed in claim 1, wherein the plurality of light emitting diodes is arranged in one of curves and circles in an order selected from the group consisting of G-R-B-R-G, R-G-B-G-R, G-R-B-B-R-G, R-G-B-B-G-R, G-R-B-G-G-B-R-G, G-R-B-B-R-G-G-R-B, wherein, R represents a red light emitting diode, G represents a green light emitting diode, and B represents a blue light emitting diode.

10. A backlight device, comprising:
    a reflection plate;
    a diffuser sheet disposed on the reflection plate; and
    a plurality of light emitting assemblies regularly arranged between the reflection plate and the diffuser sheet, each light emitting assembly comprising a metal circuit board having a first surface and an opposite second surface, a light emitting module mounted on the first surface of the metal circuit board, the light emitting module comprising a plurality of light emitting diodes each having a positive electrode and a negative electrode, the positive electrode of each light emitting diode being connected to the negative electrode of a neighboring light emitting diode, the negative electrode of the light emitting diode being connected to the positive electrode of the neighboring light emitting diode, the positive electrodes and the negative electrodes of the plurality of light emitting diodes being respectively formed on two opposite sides of the light emitting modules wherein the plurality of light emitting diodes comprising at least one red light emitting diode, at least one green light emitting diode and at least one blue light emitting diode such that mixed light emitted therefrom appears to be white light; and a cooling module attached to the second surface of the metal circuit board.

11. The backlight device as claimed in claim 10, wherein the cooling system comprises a heating dissipation device having a number of cooling fins.

12. The backlight device as claimed in claim 11, wherein the cooling fins and the metal circuit board are comprised of a heat conductive material.

13. The backlight device as claimed in claim 12, wherein the heat conductive material is selected from the group consisting of copper, aluminum and a combination alloy thereof.

14. The backlight device as claimed in claim 10, wherein the plurality of light emitting diodes is configured in a line in an order selected from the group consisting of G-R-B-R-G, R-G-B-G-R, G-R-B-B-R-G, R-G-B-B-G-R, G-R-B-G-G-B-R-G, G-R-B-B-R-G-G-R-B, wherein, R represents a red light emitting diode, G represents a green light emitting diode, and B represents a blue light emitting diode.

15. The light emitting modules as claimed in claim 10, wherein the plurality of light emitting diodes is arranged in one of a curve and a circle in an order selected from the group consisting of G-R-B-R-G, R-G-B-G-R, G-R-B-B-R-G, R-G-B-B-G-R, G-R-B-G-G-B-R-G, G-R-B-B-R-G-G-R-B, wherein, R represents a red light emitting diode, G represents a green light emitting diode, and B represents a blue light emitting diode.

* * * * *